United States Patent [19]
Infantolino

[11] Patent Number: 6,014,031
[45] Date of Patent: Jan. 11, 2000

[54] APPARATUS FOR PRESSING AN ELECTRONIC CARD AGAINST CONTACTS OF A TEST SOCKET

[75] Inventor: William Infantolino, Vestal, N.Y.

[73] Assignee: International Business Machines Corporation, Armonk, N.Y.

[21] Appl. No.: 08/762,790

[22] Filed: Dec. 10, 1996

[51] Int. Cl.⁷ ................................................. G01R 31/02
[52] U.S. Cl. .......................................... 324/755; 324/765
[58] Field of Search .................................. 324/754, 755, 324/757, 758, 765; 165/80.2, 80.3; 361/690, 692; 439/73, 330, 331

[56] References Cited

U.S. PATENT DOCUMENTS

| | | | |
|---|---|---|---|
| 4,683,423 | 7/1987 | Morton | 324/755 |
| 4,899,107 | 2/1990 | Corbett et al. | 324/765 |
| 4,962,356 | 10/1990 | Eberlein et al. | 324/755 |
| 4,969,828 | 11/1990 | Bright et al. | 439/68 |
| 5,022,462 | 6/1991 | Flint et al. | 165/80.4 |
| 5,073,117 | 12/1991 | Malhi et al. | 439/71 |
| 5,177,436 | 1/1993 | Lee | 324/754 |
| 5,266,037 | 11/1993 | Hetzel et al. | 439/72 |
| 5,307,236 | 4/1994 | Rio et al. | 361/720 |
| 5,322,446 | 6/1994 | Cearley-Cabbiness | 439/73 |
| 5,329,227 | 7/1994 | Sinclair | 324/158.1 |
| 5,339,027 | 8/1994 | Woith et al. | 324/754 |
| 5,360,348 | 11/1994 | Johnson | 439/72 |
| 5,412,866 | 5/1995 | Woith et al. | 29/848 |
| 5,414,372 | 5/1995 | Levy | 324/765 |
| 5,489,854 | 2/1996 | Buck et al. | 324/761 |
| 5,528,466 | 6/1996 | Lim et al. | 361/820 |
| 5,541,525 | 7/1996 | Wood et al. | 324/755 |

OTHER PUBLICATIONS

Research Disclosure, Jan., 1992, No. 333, .Elastomer-–Coated Rib for Optical Pressure Block. by Liutkus et al.
IBM Technical Disclosure Bulletin vol. 16, No. 12, May 1974, .Module Holder And Actuator., by Jarvela.

*Primary Examiner*—Josie Ballato
*Assistant Examiner*—Russell M. Kobert
*Attorney, Agent, or Firm*—Arthur J. Samdovitz

[57] ABSTRACT

A test structure tests an electronic card having electrical contacts on one face and a chip on the other face. By way of example, the electrical contacts on the card comprise an array of solder balls. The structure comprises a socket for receiving the card such that the electrical contacts of the card face electrical contacts within the socket. The structure further comprises a plate, received over the socket and having at least two ribs which protrude downwardly from one face of the plate and are positioned over the socket to engage a center portion of the chip when the card is received in the socket. The plate also has at least two holes. One of the ribs is positioned between the two holes but does not surround either of the holes. Consequently, forced air can flow downwardly through the holes in the plate, horizontally between the plate and the chip and out of the test structure. Preferably, the two ribs cross each other, and there are four holes in the plate which are arranged in four respective quadrants defined by the cross.

14 Claims, 10 Drawing Sheets

APPARATUS FOR PRESSING AN ELECTRONIC CARD AGAINST CONTACTS OF A TEST SOCKET

BACKGROUND OF THE INVENTION

The invention relates generally to electrical testing of electronic cards such as bare die laminate ball grid arrays and deals more particularly with an apparatus for pressing contacts of an electronic card against contacts of a test socket to ensure proper electrical connection during a test.

It was known to mount an integrated circuit or "chip" to one face of a single or multi-layer printed circuit board by solder balls such that contacts of the chip face the substrate ("flip-chip"). Typically the board and chip are both rectangular, and the chip has a smaller surface area. Then, an array of surface pads are formed by photo-lithography of copper on the other face of the board. Next, plated through holes (PTHs) are formed in the card to interconnect the chip to the array of pads. Next, solder balls are formed on the pads by a reflow process such that this face of the board contains an array of co-planar solder balls. By way of example, the solder balls comprise a tin/lead composition and have a diameter of 25–40 mils. The resultant card is called a "bare die laminate ball grid array" (BDL-BGA).

The next step is to test the electrical performance of the BDL-BGA. A "clam-shell" test structure was previously known to quickly interconnect the BDL-BGA to a test circuit. A base of the clam-shell test structure contains a test socket with an array of contacts. The BDL-BGA is placed in the socket such that the ball grid array rests over respective contacts within the socket. These contacts are the heads of pins. The pins are held in respective holes in the base of the test structure, and bottoms of the pins are soldered into a printed circuit board of electronic test equipment. The test structure also includes a top flap which is pivotally mounted to the base and includes a generally rectangular lip which protrudes downwardly toward the socket. (In a similar test structure, there is a plate sandwiched between the top flap and the base, the plate is pivotally mounted to the base and the plate includes a rectangular lip which protrudes downwardly toward the socket.) To prepare for the test, the top flap is closed such that the rectangular lip presses against the perimeter of the exposed surface of the chip to press the array of solder balls against respective contacts in the socket. Typically, each solder ball in the array requires 2–4 ounces of pressure and there can be hundreds or solder balls in the array. Therefore, considerable force is required to ensure proper electrical contact between the solder balls and the array. The chip typically comprises a hard silicon material and is therefore, brittle. Also, there may be internal stresses created by thermal expansion during formation of the BDL-BGA. The internal stresses are such that the perimeter of the upper surface of the chip is relatively sensitive to downward force. Consequently, the downward pressure of the test structure may break the chip, particularly in this case, where the rectangular lip presses against the perimeter of the surface of the chip.

Other lip shapes were also known. For example, U.S. Pat. No. 5,528,466 discloses a circular lip on the underside of a plunger. The plunger is pressed downwardly against the upper surface of an electrical component such as a surface mounted chip package or carrier. The pressure forces ball leads on the opposite surface of the electrical component against conductors on a printed circuit board. The illustrated plunger arrangement appears to contact a more central area of the electrical component than the foregoing prior art.

U.S. Pat. No. 4,683,423 illustrates a post with a circular lip which presses against the surface of a rectangular chip, although the diameter of the lip is approximately equal to the width of the chip. Consequently, the circular lip exerts considerable force on two edge regions of the chip.

During some electrical tests, the chip dissipates considerable heat, and external cooling is required. The clam-shell test structure described above includes an opening in the top flap, a break in the rectangular lip and an opening in the back of the test structure above and behind the chip. These openings form a continuous duct which is open to the air at both ends and open to the chip in the middle. A fan forces air through the duct to facilitate cooling of the chip. The test structure of U.S. Pat. No. 5,528,466 includes an air space around the chip. The test structure of U.S. Pat. No. 4,683,423 includes an axial hole in the post (above the chip) and another axial hole in the middle of the test socket (below the chip). Both holes are open to the ambient air.

A general object of the present invention is to provide a test structure for pressing an electronic card into a test socket in such a manner as to as to minimize the chance of breaking the chip or other parts of the electronic card.

Another object of the present invention is to provide a test structure of the foregoing type which facilitates cooling of the chip.

SUMMARY OF THE INVENTION

The invention resides in a test structure for testing an electronic card having electrical contacts on one face and a chip on the other face. By way of example, the electrical contacts on the card comprise an array of solder balls. The structure comprises a socket for receiving the card such that the electrical contacts of the card face electrical contacts within the socket. The structure further comprises a plate, received over the socket and having at least two ribs which protrude downwardly from one face of the plate and are positioned over the socket to engage a center portion of the chip when the card is received in the socket. The plate also has at least two holes. One of the ribs is positioned between the two holes but does not surround either of the holes. Consequently, forced air can flow downwardly through the holes in the plate, horizontally between the plate and the chip and out of the test structure.

According to one feature of the invention, two ribs on the plate cross each other. There are four holes in the plate which are arranged in four respective quadrants defined by the cross.

DETAILED DESCRIPTION OF THE PREFERRED EMBODIMENTS

Figure 1:
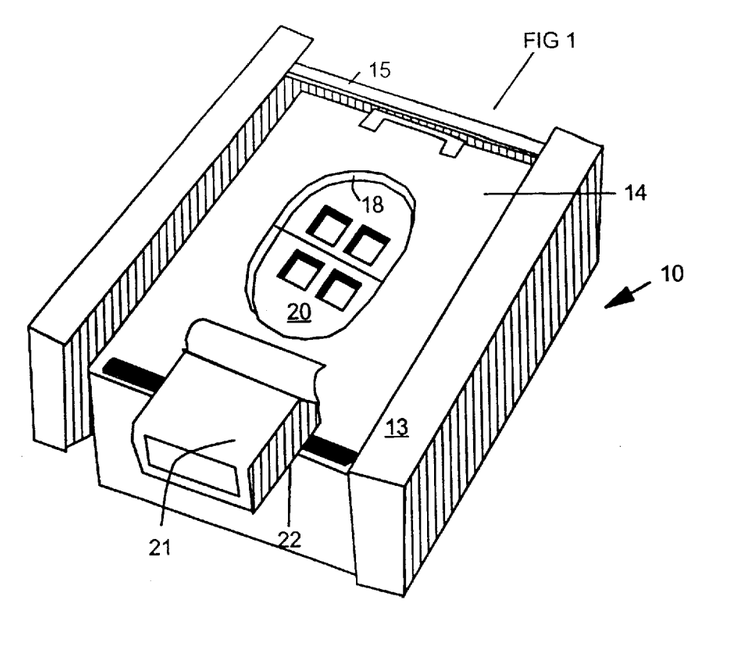
FIG. 1 is a perspective view of a prior art test structure with a pressure application plate according to the present invention. A top flap of the test structure is closed.

Referring now to the drawings in detail, wherein like reference numbers indicate like elements throughout, FIG. 1 illustrates a test structure generally designated 10 with a pressure application plate 20 according to the present invention. Test structure 10 comprises a base 13 and a top flap 14 pivotally mounted with a pin 15 on the base 14 to form a clam-shell structure. (The top flap 14 may be biased by a spring which surrounds a hidden portion of the pin 15.) Top flap 14 includes a hole 18 and a catch 20. Catch 21 is pivotally mounted on a front edge of top flap 14 using a pin 22. (The catch 21 may be biased by a return spring which surrounds a hidden portion of pin 22.) All of test structure 10 except for pressure application plate 20 was previously known.

Figure 2:
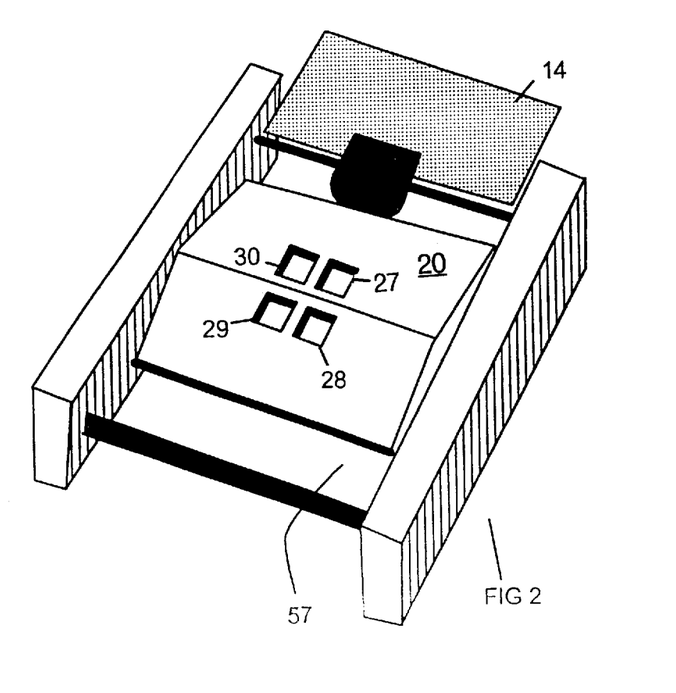
FIG. 2 is a perspective view of the prior art test structure and pressure application plate of FIG. 1 with the top flap open to further expose the pressure application plate.

FIG. 2 illustrates the test structure 10 with top flap 14 pivoted open to further expose pressure application plate 20 according to the present invention. Plate 20 is received on a floor 57 within base 13 and has four vents 27–30. When top flap 14 is open, the plate can be installed or removed.

Figure 3:
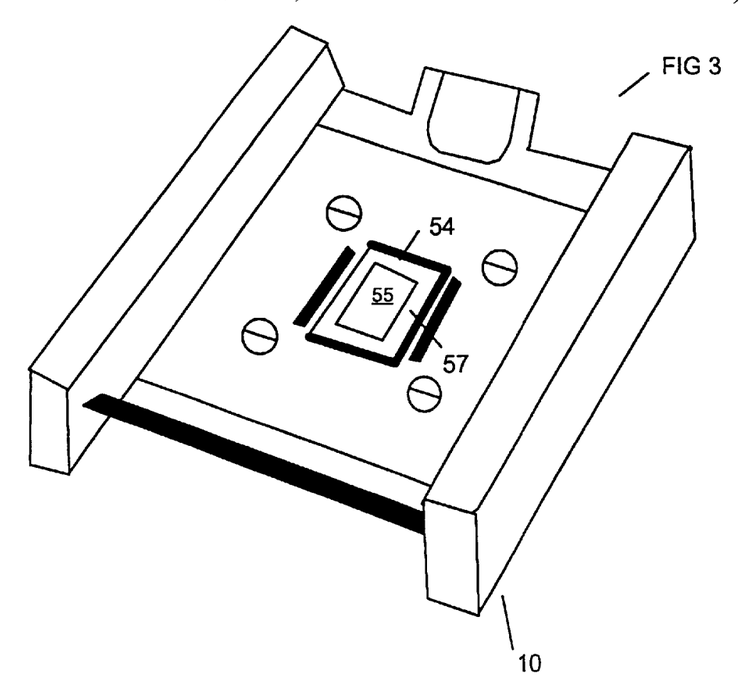
FIG. 3 is a perspective view of the prior art test structure of FIG. 2 with the top flap open and the pressure application plate removed to expose an electronic card.
Figure 4:
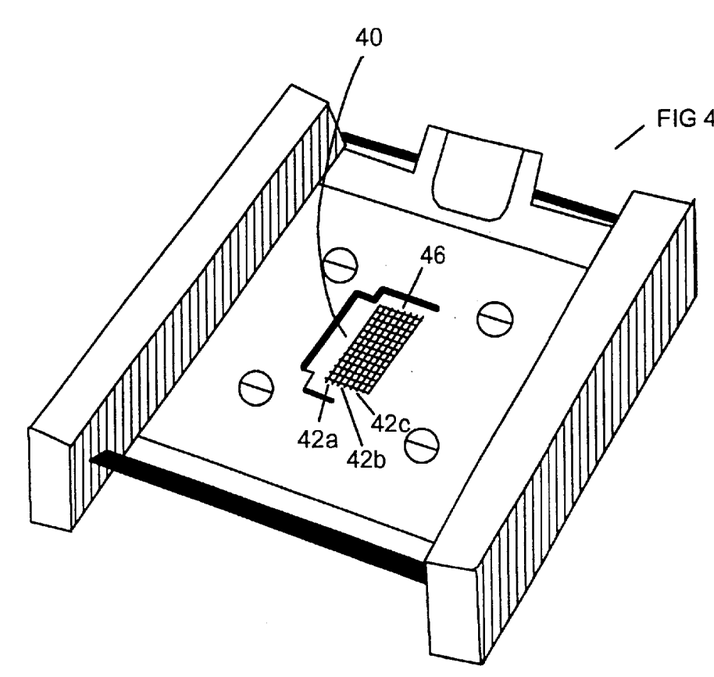
FIG. 4 is a perspective view of the prior art test structure of FIG. 3 with the top flap open and the pressure application plate and electronic card removed to expose a test socket within the test structure.

FIG. 3 illustrates the test structure 10 with top flap 14 pivoted open and pressure application plate 20 removed to expose an electronic card 54. FIG. 4 illustrates the test structure 10 with top flap 14, pressure application plate 20 and electronic card 54 removed to expose a test socket 40 in base 13 beneath the electronic card. Test socket 40 includes an array of exposed contacts 42a,b,c, etc. and a rectangular recess 46 to receive electronic card 54 such that an array of solder balls on the bottom of the electronic card 54 is aligned with the array of respective contacts 42a,b,c, etc. In one embodiment of the invention, electronic card 54 is a "bare die laminate ball grid array" (BDL-BGA) comprising a chip 55 on a single or multilayer dielectric board 57. (Although, the present invention is usable with other types of electronic cards as well.) Each contact is formed by an enlarged head of a "pogo" pin. Each head mates with a respective solder ball of the electronic card. (If desired, the top of each pin can be provided with metal fibers to mate with the respective solder ball.) Each pogo pin is held in a respective hole in base 13. Each hole has an enlarged top to receive the enlarged head of the respective pogo pin.

Figure 5:
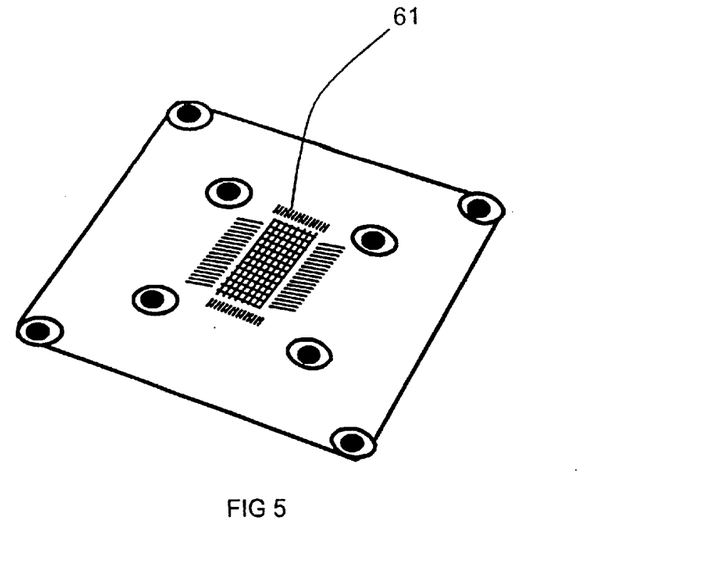
FIG. 5 is a perspective view of the prior art test structure of FIG. 4 with the top flap open and the pressure application plate, electronic card and base removed to expose a test circuit beneath the test socket.

FIG. 5 illustrates test structure 10 with a top layer of base 13 removed to illustrate a circuit board 61 of a test circuit. The bottom of each pin is received and soldered in a respective plated through hole of circuit board 61. There is an array of such holes, and the pins are located in the holes in base 13 as needed to correspond to the electronic card under test.

Figure 6:
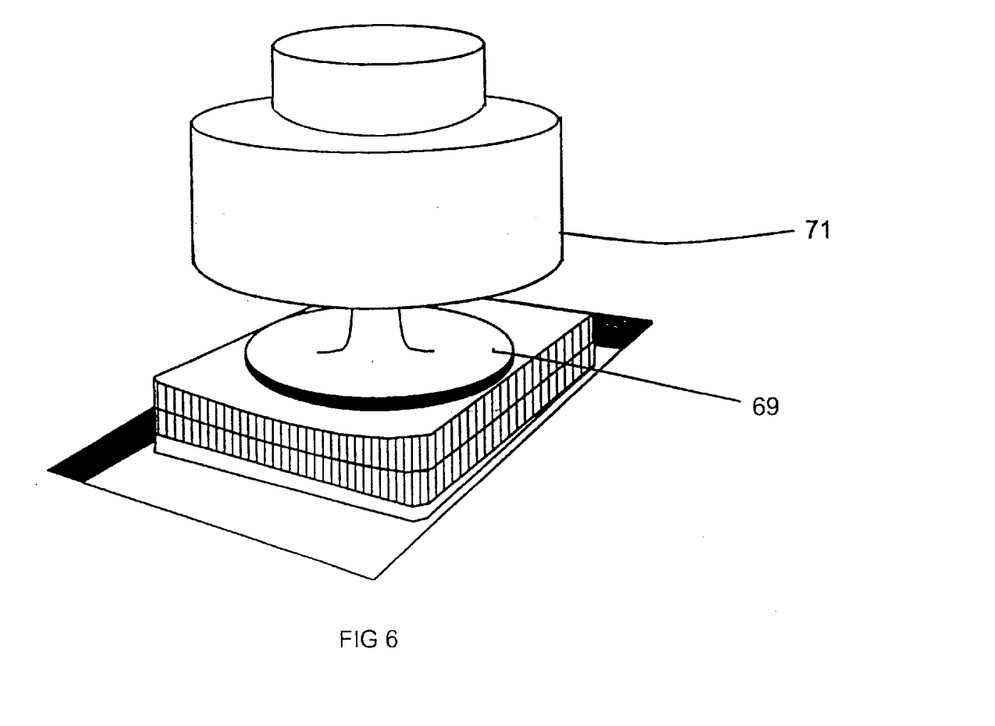
FIG. 6 is a perspective view of a prior art test structure and pressure application plate of FIG. 1 during a test. The top flap of the test structure is closed and a fan and air funnel plate are positioned over the top flap and pressure application plate.
Figure 7:
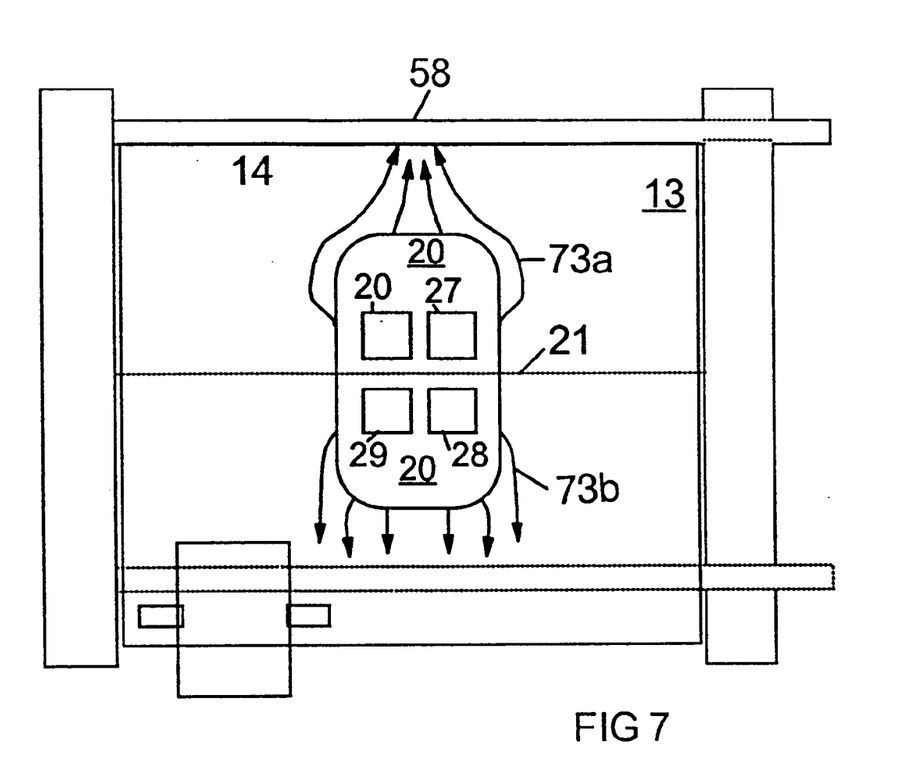
FIG. 7 is a top view of FIG. 1.
Figure 8:
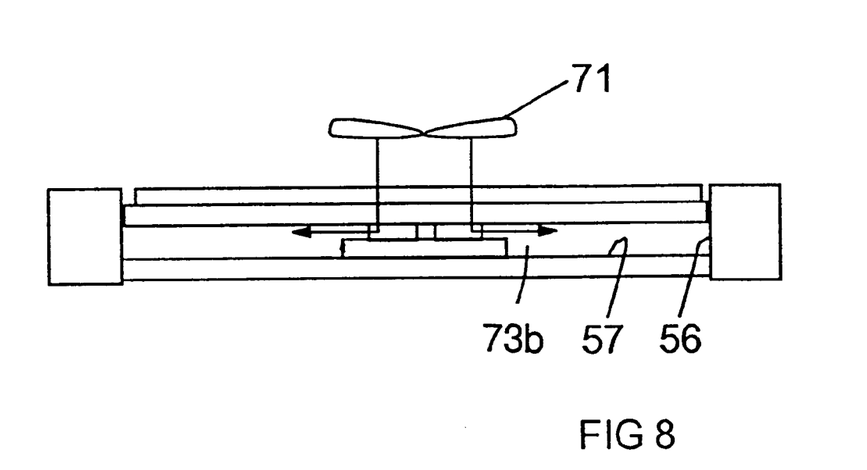
FIG. 8 is a side view of FIG. 1.

FIG. 6 illustrates test structure 10 with the electronic card 54 installed in the test socket, the pressure application plate positioned over electronic card 54 and top flap 14 closed over plate 20 in preparation for the test. When the top flap 14 is closed, the opening 18 in the top flap is positioned over vents 27–30 in plate 20. A test funnel 69 is installed over opening 18 in top flap 14 and a fan 71 directs air into vents 27–30 via funnel 69 and opening 18. (The test funnel 69 and fan 71 were previously included with previously known test structures and pressure application plates.) As further illustrated in FIGS. 7 and 8, after passing through vents 27–30, air 73a,b moves horizontally and outwardly across the exposed face of electronic card 54. Then, the air exits test structure 10 via slits 56 and 58 between the front and rear edges of plate 20 and base floor 57. This cools chip 55 on the card during the test.

Figure 9:
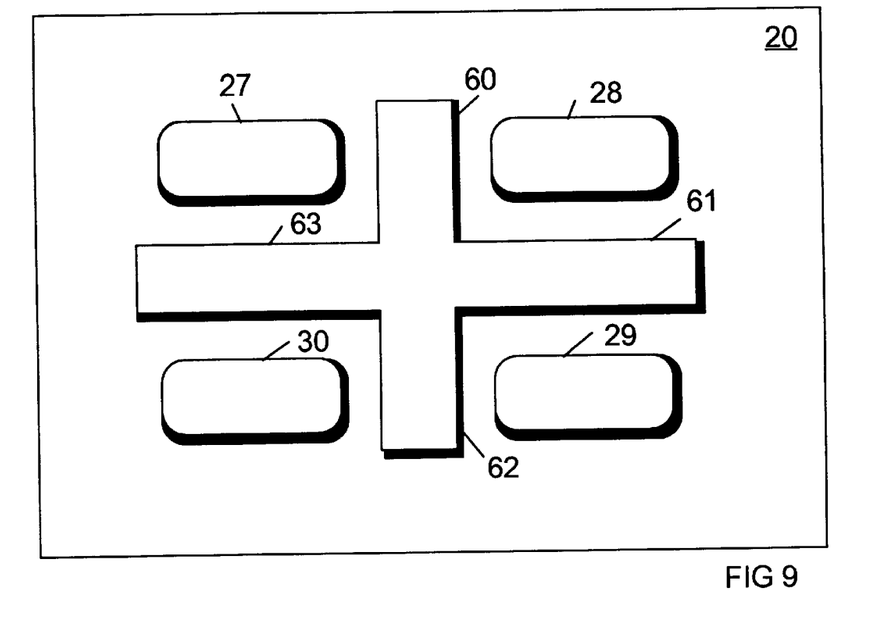
FIG. 9 is a bottom view of the pressure application plate of FIG. 1.
Figure 10:
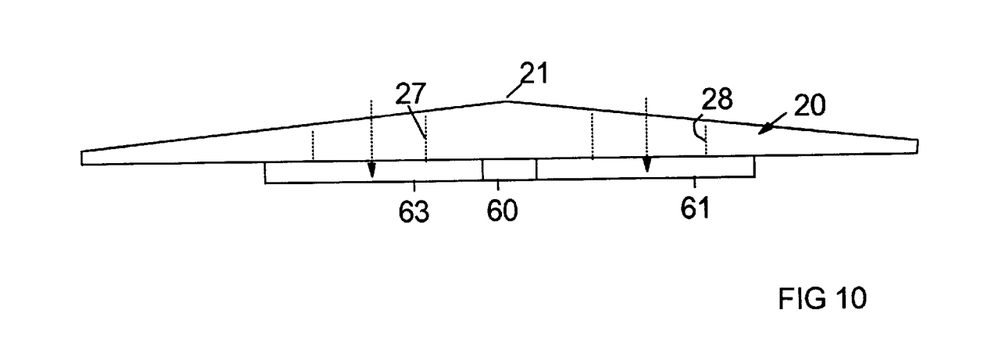
FIG. 10 is a side view of FIG. 9.

FIG. 9 illustrates the underside of the force application plate 20 and FIG. 10 illustrates a side view of the force application plate 20. The upper surface of plate 20 is sloped from an apex line 21 and the apex line 21 is parallel to pin 15 such that top flap 14 contacts apex line 21 of plate 20. This ensures that top flap 14 exerts a downward force on plate 20 and does not tend to tip plate 20 at any side edge. (Other, previously known pressure application plates were similarly sloped from an apex line down the middle. In an alternate design, the top flap 14 can have an apex line which protrudes downwardly from the underside of flap 14 parallel to pin 15, and the upper surface of plate 20 can be flat.)

The underside of plate 20 includes four protruding lips or ribs 60–63 arranged as a cross. Rib 60 is positioned between vents 27 and 28, rib 61 is positioned between vents 28 and 29, rib 62 is positioned between vents 29 and 30 and rib 63 is positioned between vents 30 and 27. The ribs 60–63 are arranged in this manner for two important reasons. During test conditions, the ribs 60–63 exert a downward force on the center portion (but not periphery) of the chip 55 on the electronic card. This reduces the chance of breaking chip 55 which is sensitive to downward force on the perimeter of the exposed surface of the chip. Also, during test conditions, the fan 71 forces cooling air downwardly through hole 18, downwardly through vents 27–30, horizontally and outwardly between plate 20 and electronic card 54 and horizontally out of the test structure via opens slits 56 and 58 between plate 20 and base floor 57. The ribs provide an offset between plate 20 and chip 55 to permit this air flow yet do not impede the air flow. Thus, test structure 10 with plate 20 provides complete and unobstructed paths for the cooling air. Yet the ribs exert a downward force on the center portion of the chip 55 to avoid breaking the chip.

Figure 11:
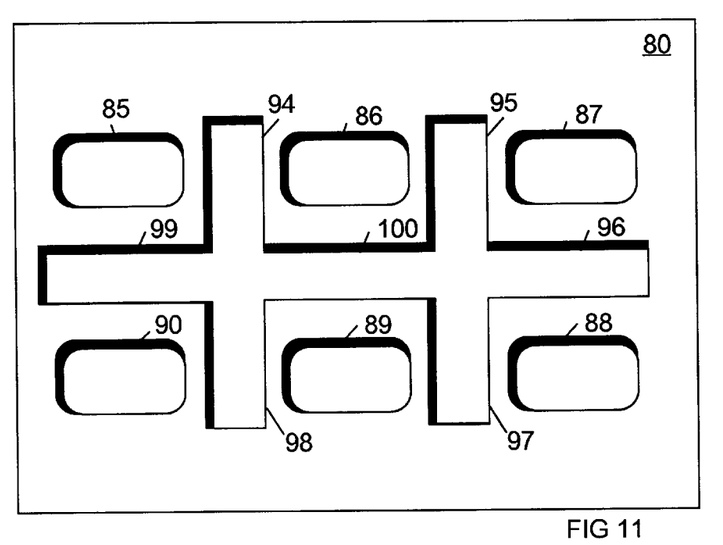
FIG. 11 is a bottom view of a second pressure application plate according to the present invention.
Figure 12:
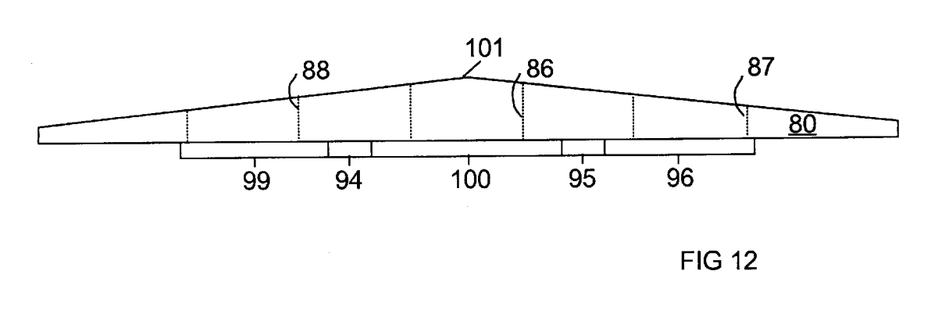
FIG. 12 is a side view of FIG. 11.

FIGS. 11 and 12 illustrate another pressure application plate 80 according to the present invention. Plate 80 includes six vents 85–90 and seven lips or ribs 94–100 which are arranged as the letter "H" and are located between sides of the vents 85–90. The upper surface of plate 80 is sloped downwardly from an apex line 101. Plate 80 can be installed in test structure 10 instead of plate 20 such that apex line 101 is parallel to pin 15. During test conditions, the ribs 94–100 exert pressure on the center region (but not periphery) of the chip 55 to avoid breaking the chip. Also during test conditions, the fan 19 forces cooling air downwardly through hole 18, downwardly through vents 94–100, horizontally and outwardly between plate 80 and electronic card 55 and horizontally out of the test structure via open slits 56 and 58 between plate 80 and base floor 57. Thus, test structure 10 with plate 80 provides complete paths for the cooling air, which paths are not obstructed by the ribs 94–100 yet the ribs exert their downward force on the center portion of the chip 55.

Figure 13:
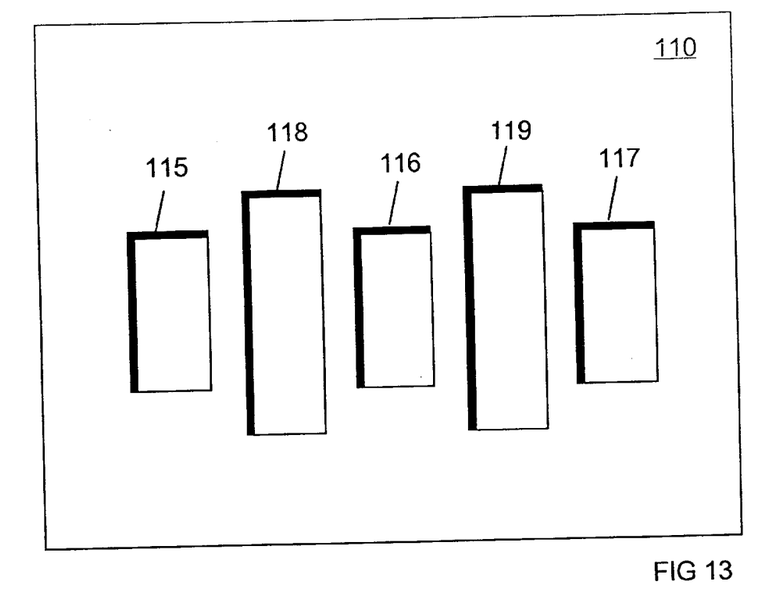
FIG. 13 is a bottom view of a third pressure application plate according to the present invention.
Figure 14:
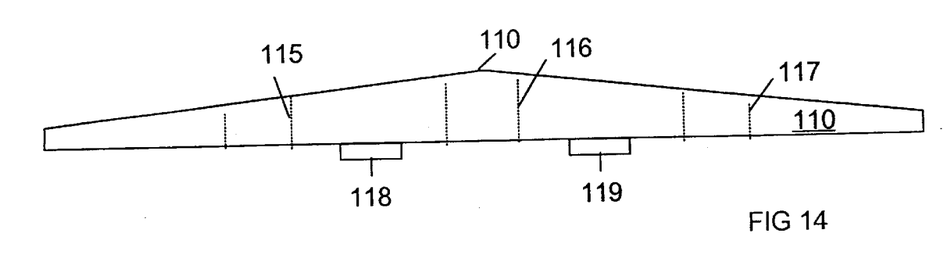
FIG. 14 is a side view of FIG. 13.

FIGS. 13 and 14 illustrate another pressure application plate 110 according to the present invention. Plate 110 includes three vents 115–117 and two lips or ribs 118–119 which are parallel to each other and interlaced with the vents. The upper surface of plate 110 is sloped downwardly from an apex line 111. Plate 110 can be installed in test structure 10 instead of plate 20 such that apex line 111 is parallel to pin 15. During test conditions, the ribs 118–119 exert pressure on the center region (but not periphery) of the chip 55 to avoid breaking the chip. Also during test conditions, the fan forces cooling air downwardly through hole 18, downwardly through vents 115–117, horizontally and outwardly between plate 110 and electronic card 55 and horizontally out of the test structure via open slits 56 and 58 between plate 110 and base floor 57. Thus, test structure 10 with plate 110 provides complete paths for the cooling air, which paths are not obstructed by the ribs 118–119 yet the ribs exert their downward force on the center portion of the chip 55.

Figure 15:
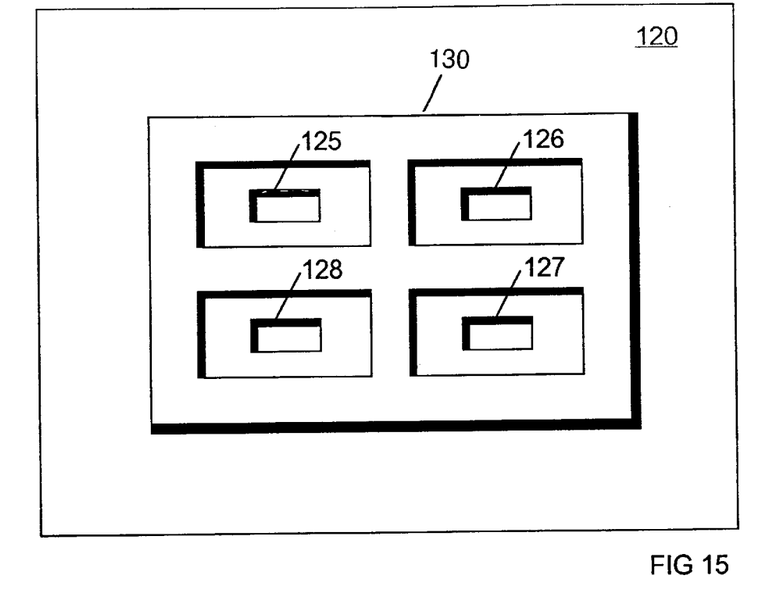
FIG. 15 is a bottom view of a fourth pressure application plate according to the present invention.
Figure 16:
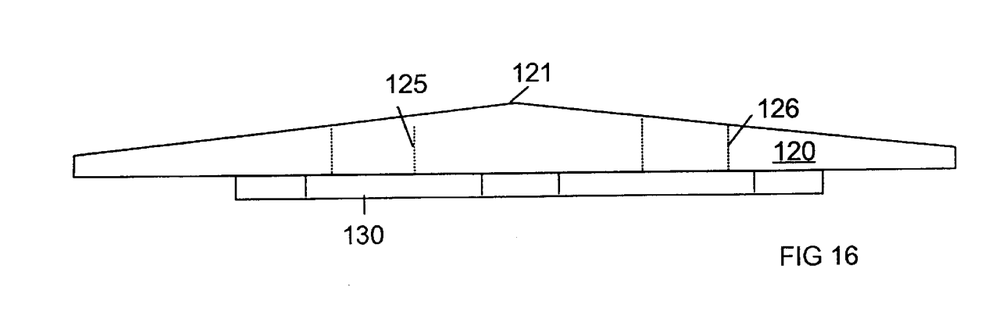
FIG. 16 is a side view of FIG. 15.

FIGS. 15 and 16 illustrate another pressure application plate 120 according to the present invention. Plate 120 includes four vents 125–128 and a lip or rib structure 130 which entirely frames each of the vents 125–128. The upper surface of plate 120 is sloped downwardly from an apex line 121. Plate 120 can be installed in test structure 10 instead of plate 20 such that apex line 121 is parallel to pin 15. During test conditions, the rib structure 130 exerts most of its pressure on the center region of the chip but also a lesser amount of pressure on the periphery of the chip 55 to avoid breaking the chip. Also during test conditions, the fan 19 forces cooling air downwardly through hole 18, downwardly through vents 125–128 and against electronic card 55, although there is no outlet (except the same opening as form the inlet). Therefore, plate 120 is useful for chips that are brittle but do not dissipate much heat.

Figure 17:
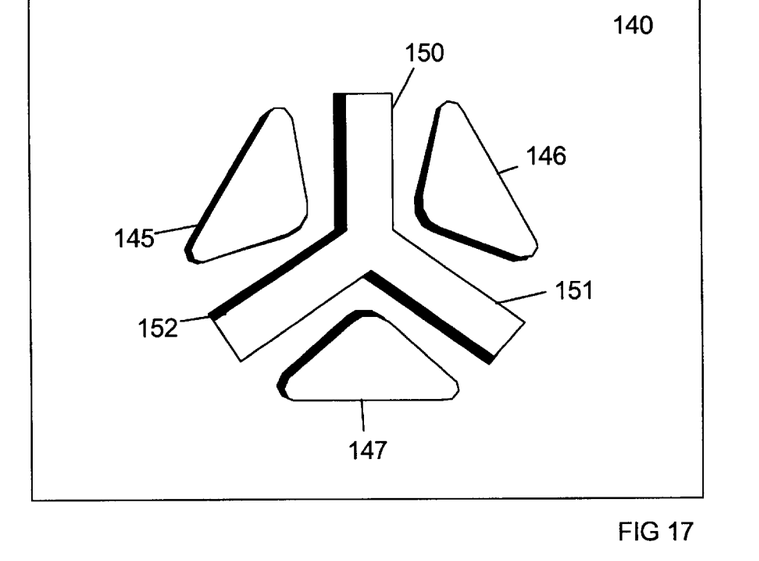
FIG. 17 is a bottom view of a fifth pressure application plate according to the present invention.
Figure 18:
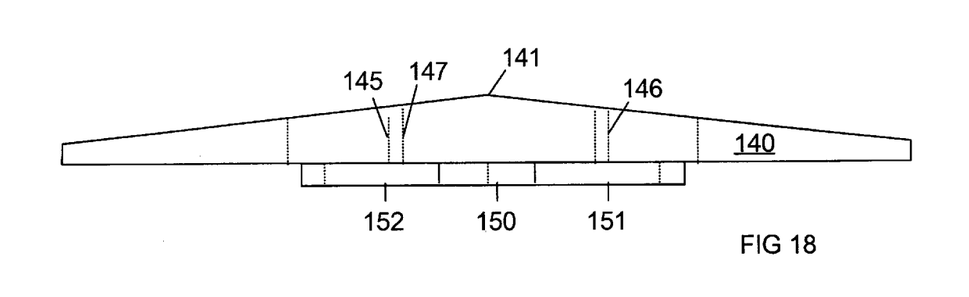
FIG. 18 is a side view of FIG. 17.

FIGS. 17 and 18 illustrate another pressure application plate 140 according to the present invention. Plate 140 includes vents 145–147 and three ribs 150–152 which are arranged in a "Y" configuration. The upper surface of plate 140 is sloped downwardly from an apex line 141. Plate 140 can be installed in test structure 10 instead of plate 20 such that apex line 141 is parallel to pin 15. During test conditions, the ribs 150–152 exert pressure on the center region (but not periphery) of the chip 55 to avoid breaking the chip. Also during test conditions, the fan 71 forces cooling air downwardly through hole 18, downwardly through vents 145–147, horizontally and outwardly between plate 140 and electronic card 55 and horizontally out of the test structure via open slits 56 and 58 between plate 140 and base floor 57. Thus, test structure 10 with plate 140 provides complete paths for the cooling air, which paths are not obstructed by the ribs 145–147 yet the ribs exert a downward force on the center portion of the chip.

Figure 19:
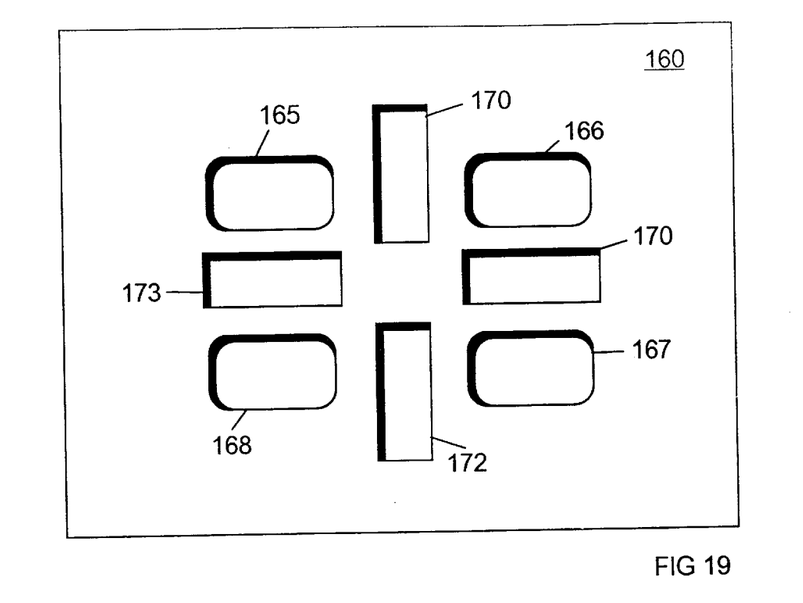
FIG. 19 is a bottom view of a sixth pressure application plate according to the present invention.
Figure 20:
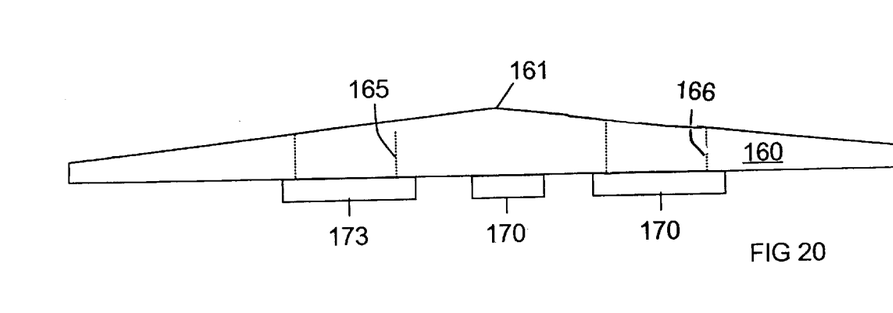
FIG. 20 is a side view of FIG. 19.

FIGS. 19 and 20 illustrate another pressure application plate 160 according to the present invention. Plate 160 includes four vents 165–168 and four ribs 170–173 which are arranged as a cross except they do not meet in the middle. The upper surface of plate 160 is sloped downwardly from an apex line 161. Plate 160 can be installed in test structure 10 instead of plate 20 such that apex line 161 is parallel to pin 15. During test conditions, the ribs 170–173 exert a downward force on the center region (but not periphery) of the chip 55 to avoid breaking the chip. Also during test conditions, the fan 71 forces cooling air downwardly through hole 18, downwardly through vents 165–168, horizontally and outwardly between plate 160 and circuit card 54 and horizontally out of the test structure via open slits 56 and 58 between plate 160 and base floor 57. Thus, test structure 10 with plate 160 provides complete paths for the cooling air, which paths are not obstructed by the ribs 165–168 yet the ribs exert a downward force on the center portion of the chip.

For most applications, the foregoing pressure application plates are all made from hard plastic such as Ryton (tm of Phillips Chemical Company) plastic. However, for extremely brittle chips, the ribs are made of a more compliant material such as silicon rubber while the remainder of the pressure application plates are made of hard plastic. The silicon rubber is able to withstand the temperature of the chip without melting or degrading.

Based on the foregoing, various pressure application plates for a test structure for an electronic card have been disclosed. However, numerous modifications and substitutions can be made to the pressure application plates without deviating from the scope of the present invention. Therefore, the present invention has been disclosed by way of illustration and not limitation and reference should be made to the following claims to determine the scope of the present invention.

What is claimed is:

1. A test structure for testing an electronic card having electrical contacts on one face and a chip on another face, said structure comprising:

a socket for receiving said card such that said electrical contacts of said card face electrical contacts within said socket; and a plate, received over said socket and having at least two ribs which protrude downwardly from one face of the plate and are positioned over said socket to engage a center portion of said chip when said card is received in said socket, said plate also having at least two holes, one of said ribs being positioned between said two holes but not surrounding either of said holes, whereby air can flow downwardly through said holes in said plate, horizontally between said plate and said chip and out of said test structure.

2. A test structure as set forth in claim 1 further comprising means for pressing said plate against said card to ensure electrical connection between said electrical contacts of said card and said electrical contacts within said socket.

3. A test structure as set forth in claim 1 wherein said electrical contracts of said card comprise an array of solder balls.

4. A test structure as set forth in claim 1 further comprising means for forcing air downwardly through said holes.

5. A test structure as set forth in claim 1 wherein said ribs are integral with said plate.

6. A test structure for testing an electronic card having electrical contacts on one face and a chip on another face, said structure comprising:

a socket for receiving said card such that said electrical contacts of said card face electrical contacts within said socket; and a plate received over said socket and having two ribs which cross each other, protrude downwardly from one face of the plate and are positioned over said socket to engage a center portion of said chip when said card is received in said socket, said plate also having four holes arranged in four respective quadrants defined by said cross.

7. A test structure as set forth in claim 6 further comprising:

means for pressing said plate against said card such that said ribs press against said chip and said electrical contacts of said electronic card make electrical contact with said electrical contacts in said socket.

8. A test structure as set forth in claim 6 wherein said electrical contacts of said card comprise an array of solder balls.

9. A test structure as set forth in claim 6 further comprising means for forcing air through said holes, said air passing across said chip under said plate and exiting said test structure through a slit beneath said plate.

10. A test structure as set forth in claim 6 wherein the holes are adjacent to inner corners of said cross such that each rib at least partially separates two adjacent holes.

11. A test structure as set forth in claim 6 further comprising another rib which crosses one of the ribs of the first said cross and wherein said plate includes two additional holes and said other rib is situated between said two additional holes and two holes of said four holes.

12. A test structure as set forth in claim 6 further comprising four additional protruding ribs which are arranged in a rectangular configuration surrounding and adjoining all four ends of said cross, said four holes being situated in four respective rectangular regions defined by said ribs.

13. A test structure as set forth in claim 6 wherein said two ribs are perpendicular to each other.

14. A test structure as set forth in claim 5 wherein said ribs are integral with said plate.

* * * * *